(12) United States Patent
Chainer

(10) Patent No.: US 7,749,812 B2
(45) Date of Patent: Jul. 6, 2010

(54) HEAT SINK WITH THERMALLY COMPLIANT BEAMS

(75) Inventor: Timothy J Chainer, Putnam Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 303 days.

(21) Appl. No.: 11/834,552

(22) Filed: Aug. 6, 2007

(65) Prior Publication Data
US 2009/0039499 A1 Feb. 12, 2009

(51) Int. Cl.
*H01L 21/44* (2006.01)
*H01L 21/48* (2006.01)
*H01L 21/50* (2006.01)

(52) U.S. Cl. .................. 438/122; 257/706; 257/707; 361/704; 361/719

(58) Field of Classification Search .......... 438/118, 438/121, 122; 257/706, 707, E23.193; 361/704, 361/719
See application file for complete search history.

(56) References Cited

U.S. PATENT DOCUMENTS

| | | | |
|---|---|---|---|
| 5,579,205 A * | 11/1996 | Tustaniwskyj et al. | 361/704 |
| 6,730,998 B1 * | 5/2004 | Williams et al. | 257/712 |
| 6,851,120 B2 * | 2/2005 | Crane et al. | 720/674 |
| 7,195,381 B2 * | 3/2007 | Lynam et al. | 362/494 |
| 2004/0080033 A1 * | 4/2004 | Fang | 257/678 |

* cited by examiner

*Primary Examiner*—Phuc T Dang
(74) *Attorney, Agent, or Firm*—Michael J. Buchenhorner; Vazken Alexanian

(57) ABSTRACT

A heat dissipating structure includes: a heat spreader; and a plurality of compliant beams attached to the heat spreader. The beams are formed of a high-conductive material such that a maximum stress of each beam is less than a fatigue stress of the high-conductive material; said beams are placed at an angle relative to a chip surface such that the beams are able to exert bending compliance in response to x, y, and z forces exerted upon them. The structure also includes a thermal material interface for bonding said structure to the chip surface. Both the heat spreader and the compliant beams can be machined from a copper block. An alternative heat dissipating structure includes compliant beams soldered to the chip surface.

4 Claims, 8 Drawing Sheets

Chip Package Design with Compliant "Fingers"

Basic Chip Package Design

Chip Package Design with Compliant "Fingers"

Bottom View

*Neutral Point*

*Compliant Fingers Soldered to Chip*

HEAT SINK WITH THERMALLY COMPLIANT BEAMS

CROSS-REFERENCE TO RELATED APPLICATIONS

Not Applicable.

STATEMENT REGARDING FEDERALLY SPONSORED-RESEARCH OR DEVELOPMENT

Not Applicable.

INCORPORATION BY REFERENCE OF MATERIAL SUBMITTED ON A COMPACT DISC

Not Applicable.

FIELD OF THE INVENTION

The invention disclosed broadly relates to the field of cooling devices for microelectronic devices, and more particularly relates to the field of compliant thermal heat sinks.

BACKGROUND OF THE INVENTION

A heat sink is a device that is attached to a microprocessor chip to keep it from overheating by conducting the heat generated from the chip to the ambient environment which may be air or a liquid coolant. Basic heat sink structures include a heat spreader which makes thermal contact with the silicon chip via an interface of a thermally conductive adhesive and a set of fins which provide for conduction of the heat from the chip to the ambient environment. The purpose of the heat spreader is to provide good thermal conduction of heat emanating from the chip area to a larger area of the heat sink. For air cooled heat sinks, the larger area would comprise a plurality of fins which may be made of copper or aluminum to transfer the heat to the ambient air.

The thickness and reliability of the thermal interface is determined by a number of factors, including mechanical deformation of the package stack. There are many types of thermal interface materials used, including thermal pastes, liquids, epoxies, and metals.

In the case of paste thermal interfaces, changes in the thermal interface gap due to bowing of the chip or spreader can lead to paste pumping and thermal interface failure. In the case of epoxy or metal interfaces the coefficient of thermal expansion (CTE) mismatch between the heat spreader and the chip results in stress on the interface which may lead to adhesion failures. The stiffness of the spreader itself can also contribute to internal stresses.

Most computers or microprocessors sold today will have a heat sink already attached to the chip. This combination of the chip carrier, chip and heat sink is often referred to as the "chip package." The basic design of a chip package is shown in FIG. 1 in which a non-compliant heat spreader 108 makes thermal contact with the chip 104 through a thermal interface material 106. The chip 104 makes contact with the carrier substrate 102 via solder balls 110 which produce electrical and mechanical connections between the chip 104 and the substrate 102.

In addition, epoxy underfill is used to create a mechanical bond between the chip and the substrate to reduce the mechanical forces on the solder balls 110. There are a number of stresses induced on the thermal interface 106 as a result of the CTE mismatch between the heat spreader 106, the chip 104 and the chip carrier 102. In some cases the heat spreader may be mechanically attached to the carrier, which can result in bowing of the chip package and generates forces and dimensional changes of the thermal interface gap.

Currently produced heat sinks fail to provide for the structural stresses and strains generated during the operation of the electronic device. There is a need for a heat spreader which provides high thermal conductivity and compliance in all directions and provides a means to enable thermal conduction while maintaining a very small or zero gap between the chip and heat spreader.

SUMMARY OF THE INVENTION

Briefly, according to embodiments of the present invention, a heat sink structure provides high thermal conductivity and compliance in all directions and enables thermal conduction while maintaining a very small or zero gap between the chip and heat spreader. The low-cost, heat dissipating structure includes: a heat spreader and a plurality of compliant beams attached to the heat spreader. The beams are formed of a high-conductive material such that a maximum stress of each beam is less than a fatigue stress of the high-conductive material. The beams are placed at an angle relative to a chip surface such that the beams are able to exert bending compliance in response to X, Y, and Z forces exerted upon them. Additionally, the structure includes a thermal interface material for bonding the structure to the chip surface. Both the heat spreader and the compliant beams can be machined from a copper block. An alternative heat dissipating structure includes the compliant beams soldered to the chip surface.

According to an embodiment of the present invention, a method for creating a heat dissipating structure includes: shaping a plurality of compliant beams; attaching the plurality of compliant beams to a surface of a heat spreader, the compliant beams formed of a high-conductive material such that a maximum stress of each compliant beam is less than a fatigue stress of the high-conductive material; and placing the compliant beams at an angle relative to a chip surface such that the compliant beams are able to exert bending compliance in response to any X, Y, and Z forces exerted upon them.

The method also includes placing the heat spreader under a bearing weight to exert Z forces on the compliant beams to bring them into physical contact with the chip surface. The compliant beams are placed at an angle lying between forty-five degrees and eighty-five degrees relative to the chip surface. The bottom surface of each compliant beam is parallel to the chip surface.

BRIEF DESCRIPTION OF THE DRAWINGS

To describe the exemplary purposes, aspects, and advantages of the present invention, we use the following detailed description of exemplary embodiments of the invention with reference to the drawings, in which.

DESCRIPTION OF THE PREFERRED EMBODIMENT

Figure 1:
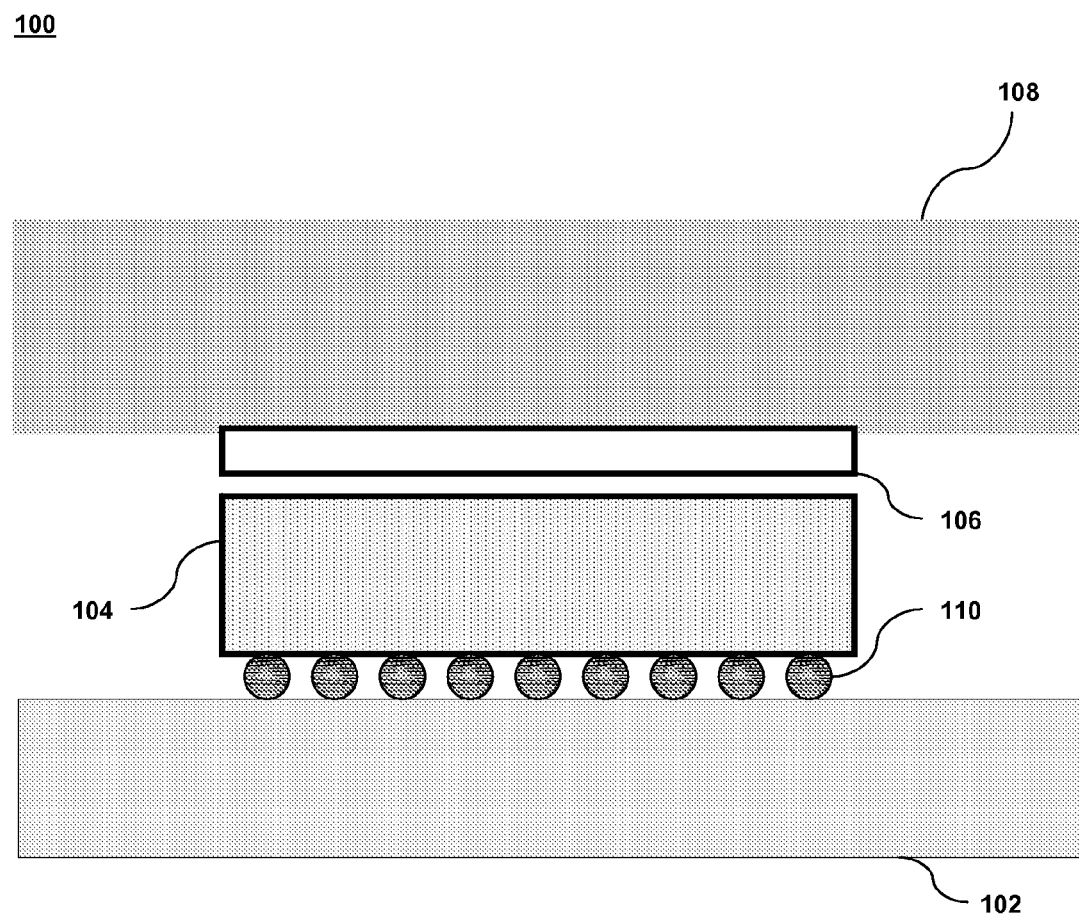
FIG. 1 is an illustration of a basic design of a chip package, according to the known art.

We describe a novel, low-cost heat sink structure which provides compliance in all directions while maintaining a gap of substantially zero between the chip and heat spreader. Compliance is achieved through the use of angled beams.

Referring now in specific detail to the drawings, and particularly FIG. 2, there is illustrated a block diagram of a chip package with compliant "fingers" 212 according to an embodiment of the invention. To create the fingers a copper alloy or other high conductivity material block is machined to produce compliant "fingers" which contact the chip. The fingers 212 are machined such that they make contact with the chip at an angle relative to the chip surface, providing compliant beams which are able to bend in response to changes in the relative position of the chip 204 to the heat spreader 208 in the X, Y, and Z directions. The fingers 212 may be fabricated by cutting a solid copper alloy block at an angle in an X-Y pattern to a predetermined depth to create fingers or beams which are at an angle in a vertical direction. Each beam can move independently to accommodate the difference in CTE between the heat sink and chip 204. In this example, the heat spreader 208 is mechanically attached to the chip carrier 202 by attachments 214. Fins 209 are also shown.

The bottoms of the fingers are parallel to the chip surface. FIG. 2b shows a view of the bottom surface of the chip 204. An angle of sixty degrees could be used, but any angle between forty-five degrees and eighty-five degrees is preferable.

Beams 212 can be made at a 90 degree angle (perpendicular) to the surface and would provide compliance in the X and Y directions; however the beams 212 would need to "buckle" to provide compliance in the Z direction. Beams 212 may be made of multiple angles and shapes to optimize compliance. For example in FIG. 2c, the beam 212 is made with two angles to provide compliance in the X, Y, and Z directions. Also shown in FIG. 2d, an "S" shape would also provide compliance in the X, Y, and Z directions. The spacing and angle of the beams 212 may also depend upon the distance from a neutral point of the chip (center of chip) as shown in FIG. 2C, in which the springs are symmetric with respect to the neutral point.

The springs may be designed to anticipate that changes in the relative displacement will be larger from the neutral point 240. As shown in FIG. 2C, the outermost springs have a longer vertical beam structure to allow for increased compliance in the X and Y directions as expected from the relative displacement of the heat spreader 208 and the chip 204 due to the CTE mismatch and distance from the neutral point 240.

Figure 2A:
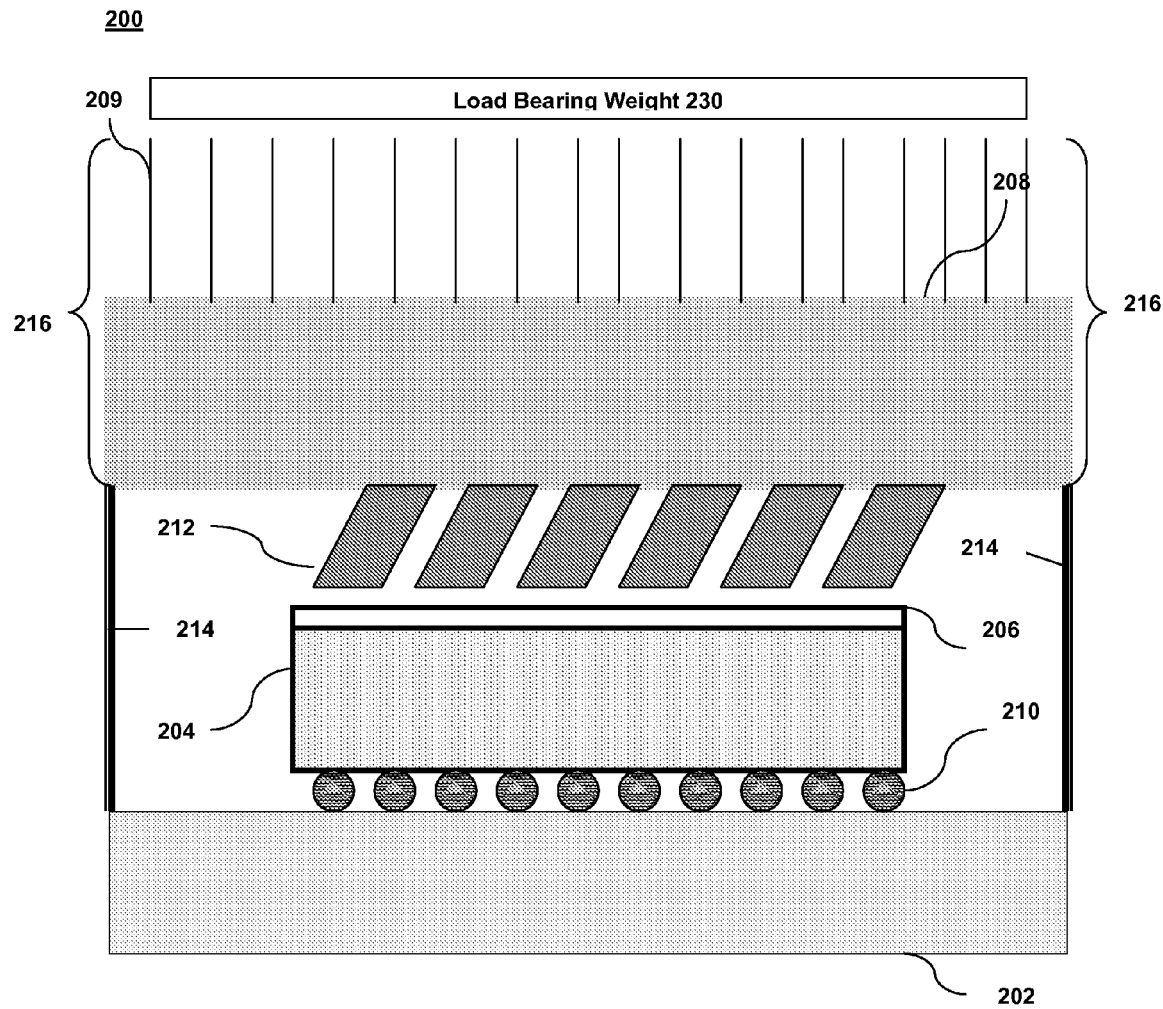
FIG. 2a is an illustration of a chip package side view with compliant fingers according to an embodiment of the present invention.
Figure 2B:
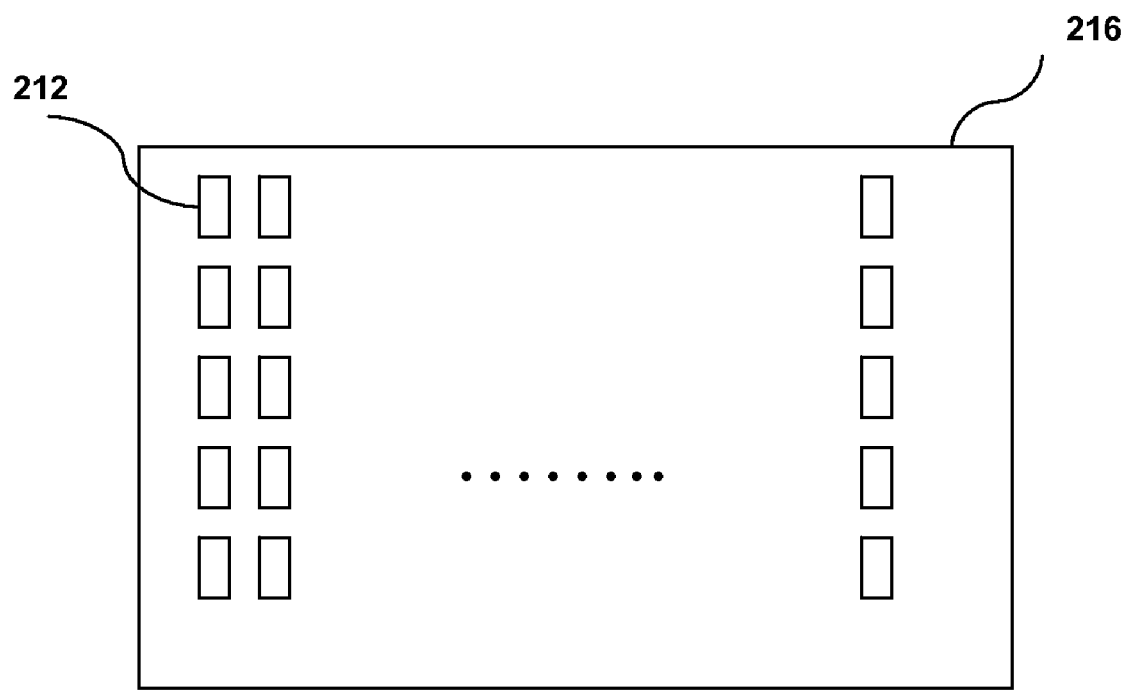
FIG. 2b is an illustrative bottom view of the chip package, according to an embodiment of the present invention.
Figure 2C:
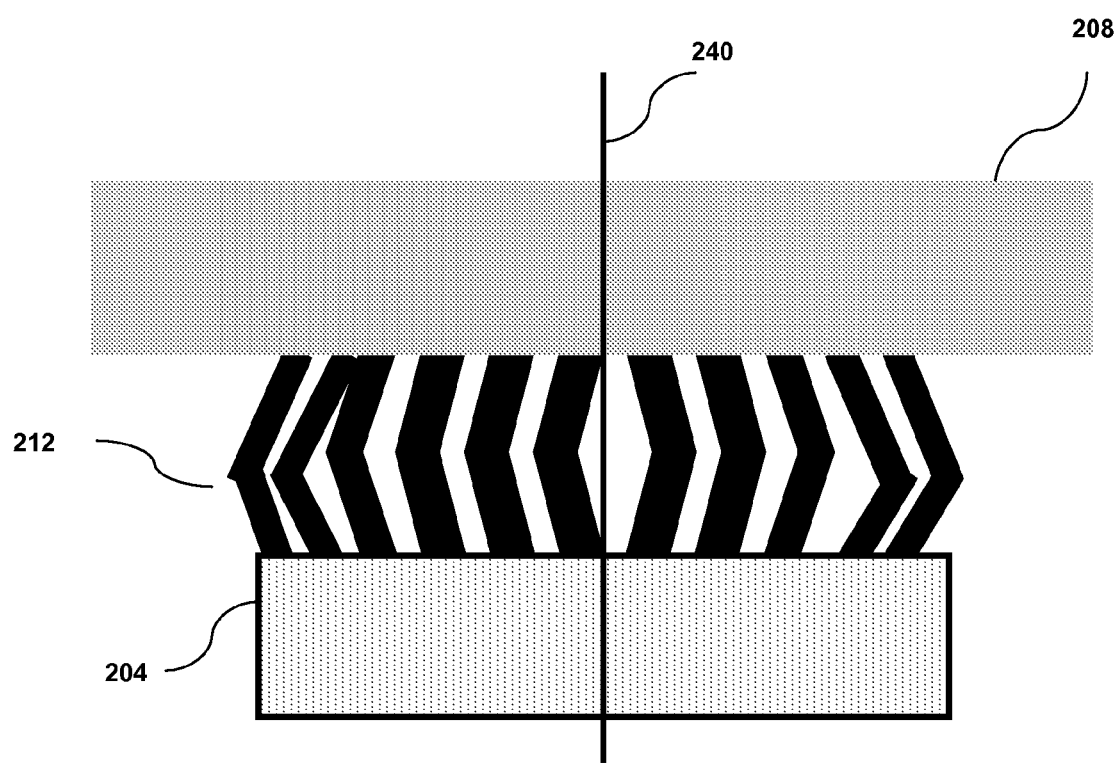
FIG. 2c is an illustrative view of the chip package including beams with two angles, according to an embodiment of the present invention.
Figure 2D:
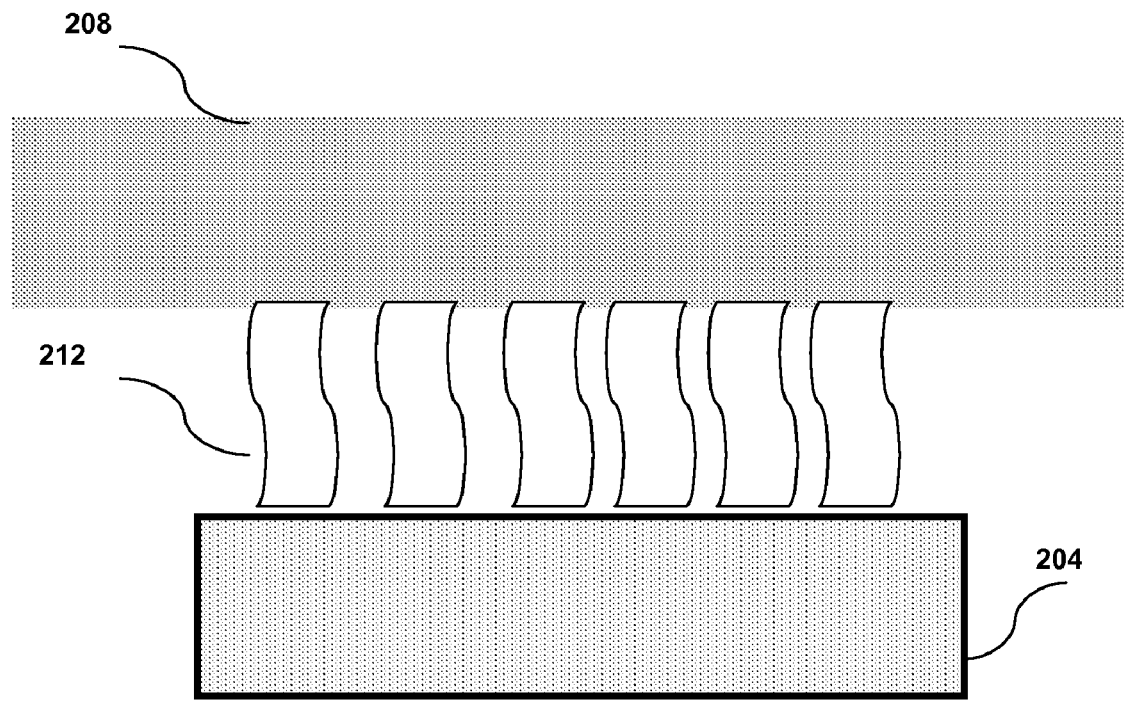
FIG. 2d is an illustrative view of the chip package including beams with an "S" shape, according to an embodiment of the present invention.
Figure 2E:
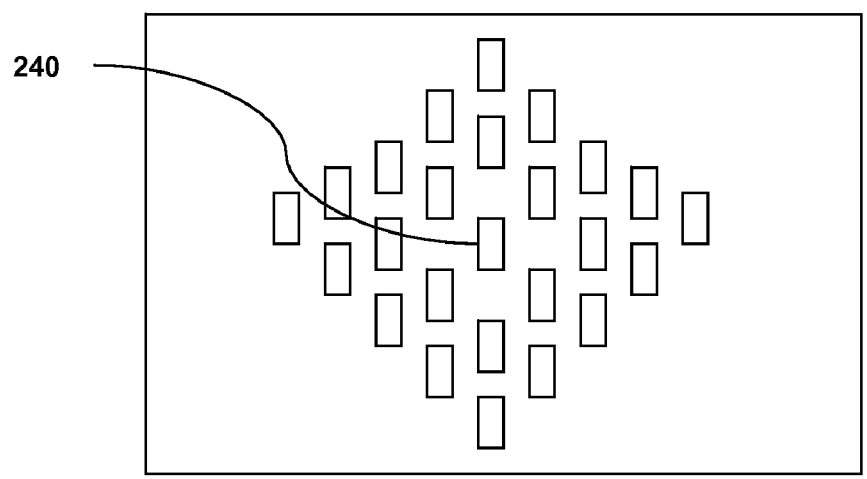
FIG. 2e is an illustration showing a chip package design from a neutral point.

As shown in FIG. 2E, the beams 212 would be designed based upon the distance from the neutral point 240, to allow for increased compliance as the beams 212 would form a radial pattern.

The compliance of the fingers 212 can be used to maintain a thin bondline between the chip surface 204 and the copper spreader 208. A bondline is best described as an interface between an adhesive and the surface to which it adheres. The material selected for the fingers 212 must also have adequate tensile strength to be able to spring back into its original shape after deformation, when any applied pressure is removed. Although the fingers 212 can be produced from any high conductive material with good fatigue properties, for simplicity and clarity the fingers 212 shown in the illustrations are described as Beryllium copper beams. Beryllium is preferable because it has both qualities of high conductivity and fatigue resistance.

There are a variety of thermal interface materials in use today. In the cases where pastes are used as thermal interfaces, the pastes provide compliance in the X, Y and Z directions between the heat sink and chip surface. However, paste pumping occurs when significant pressure is applied in the Z direction to change the gap spacing of the thermal interface, causing the paste to spread out of the area where it was applied. In cases where epoxy or a metal interface is used, compliance may be required in the X, Y and Z directions (horizontal, diagonal, and vertical, respectively) to reduce the stress on the interface 206. Because they are generally more stiff and inflexible than paste, the epoxy or metal interfaces show significant stress when radial pressure exerts force on the heat sink 216 in the X, Y, and Z directions or when movement occurs in a radial direction.

In an embodiment of the present invention the heat sink 216 may be placed under a load 230 to bear down on the fingers 212 and bring them into physical contact with the surface of the chip 204. The fingers 212 will support the load bearing weight 230, with the compliance of each finger 212 providing bending to bring the finger 212 in good contact with the chip surface 204. To ensure that the fingers 212 do not experience inelastic deformation it is important to design the fingers 212 such that the maximum stress of each beam 212 is below the fatigue stress of Beryllium copper (or whatever material is used).

Figure 3:
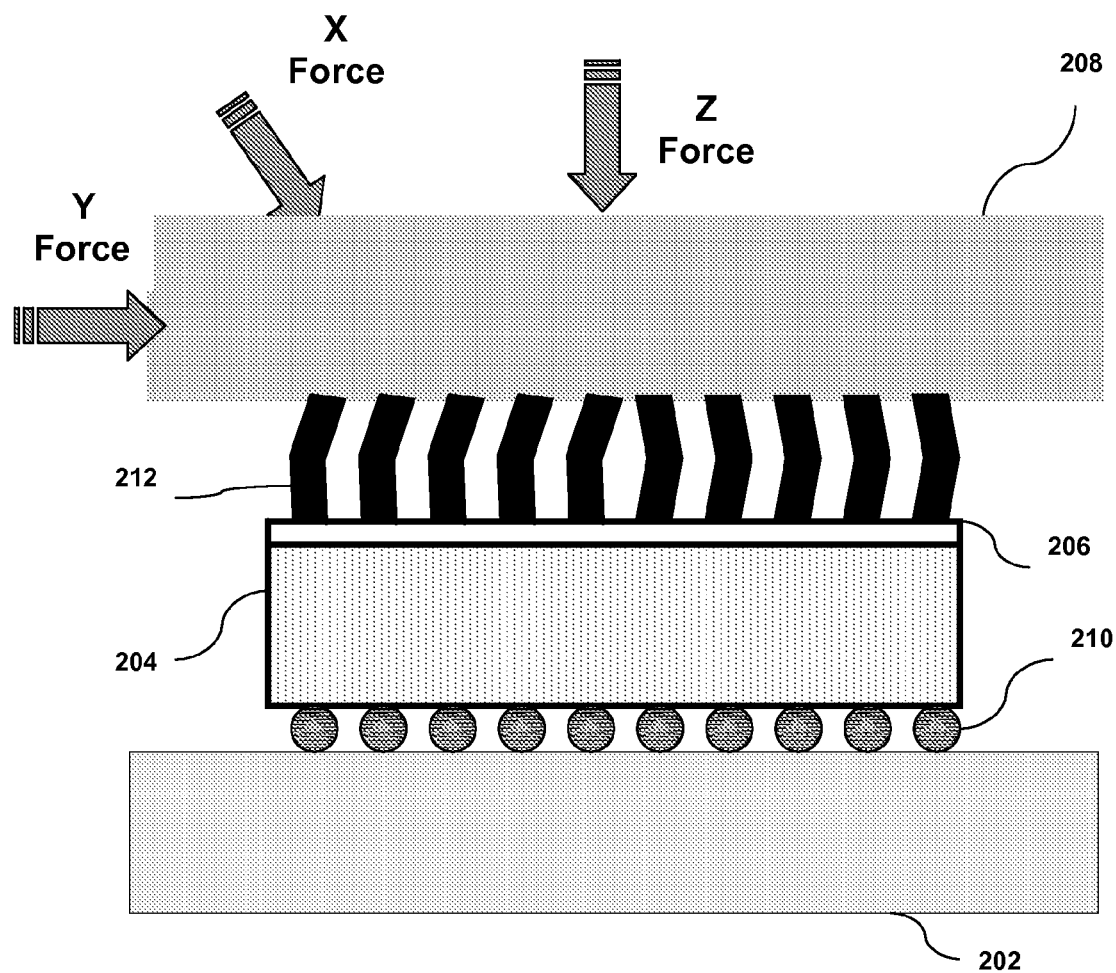
FIG. 3 is an illustration of the chip package of FIG. 2 showing the bending of the compliant figures under force, according to an embodiment of the present invention.

Referring now to FIG. 3 there is illustrated the chip package 200 of FIG. 2a with the compliant fingers 212 in bending compliance due to X, Y, and Z forces acted upon the heat spreader 208, according to an embodiment of the present invention. FIG. 3 shows how the angled fingers 212 bend yet still maintain good thermal contact with the chip 204. As is readily apparent, there is virtually no gap between the fingers 212 and the thermal interface 206, producing an optimal thermally conductive seal. The fingers 212 of FIG. 3 show the bending in one direction, depending on the type of force acted upon the heat spreader 208.

Figure 4:
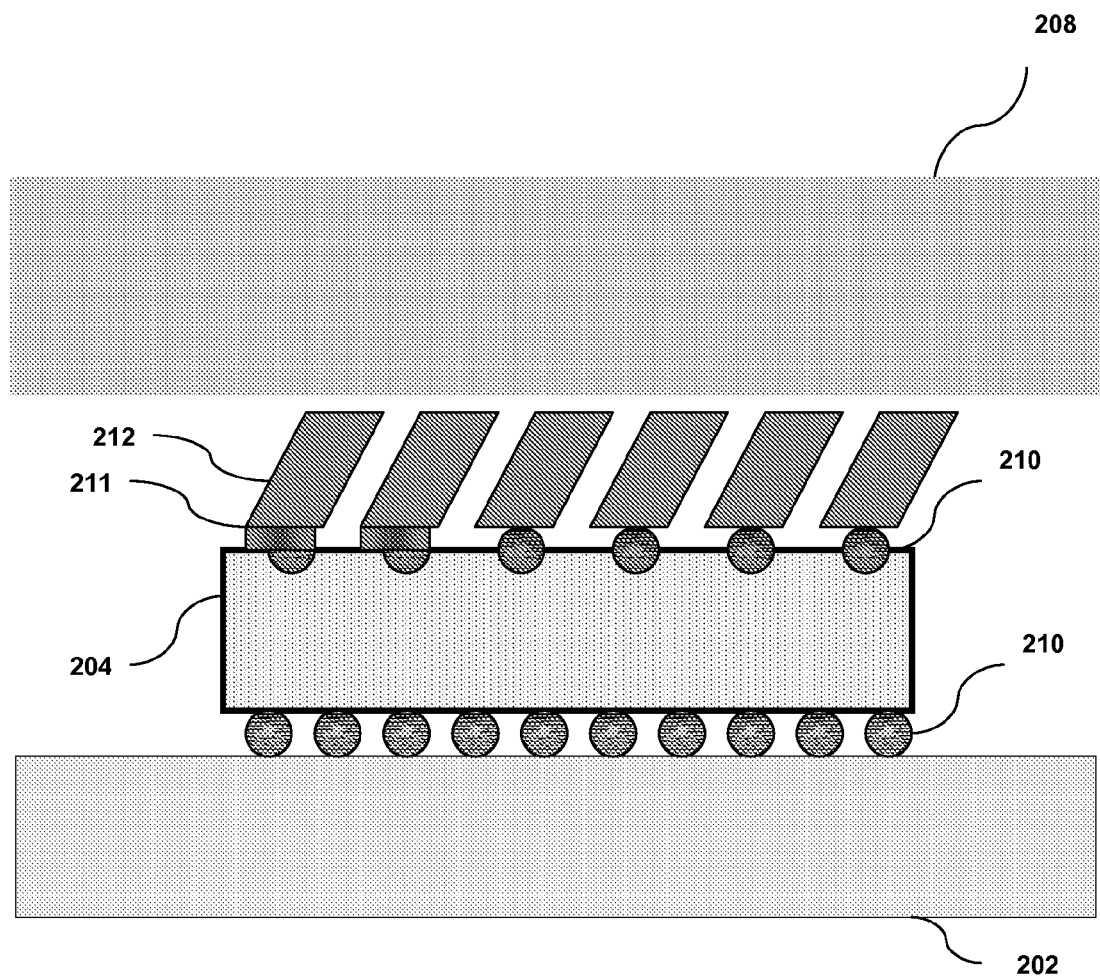
FIG. 4 is an illustration of a chip package with the fingers soldered to the chip, according to another embodiment of the present invention.

Referring to FIG. 4 there is shown another embodiment of the present invention wherein the fingers 212 are attached directly to the chip surface 204 by soldering. This is an alternative thermal interface. Together with the compliant fingers 212, compliance in multiple directions is achieved to reduce the stress on the thermal interface. In this embodiment additional compliance is achieved with the solder balls 210. Solder pads 211 can also be used.

Figure 5:
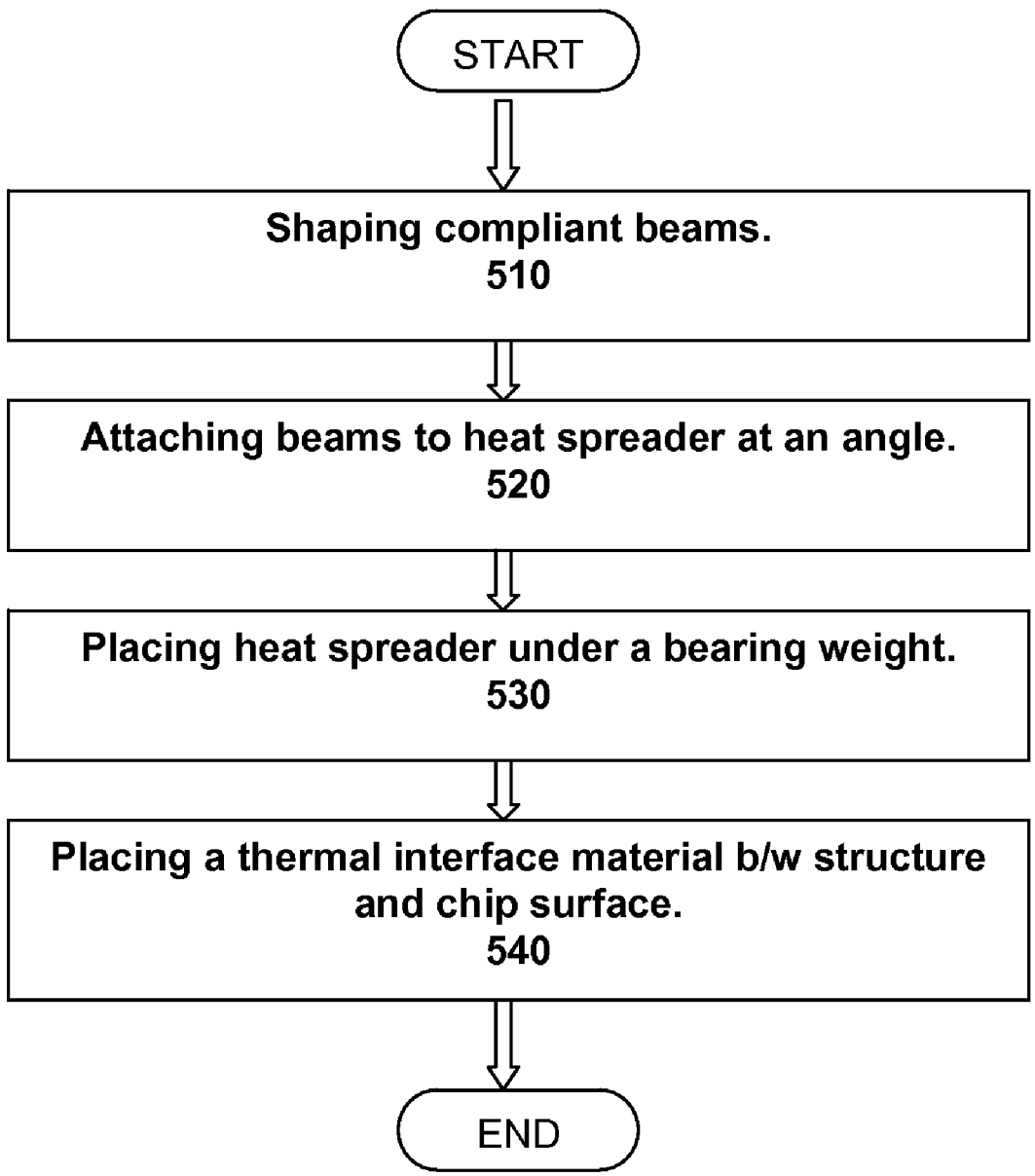
FIG. 5 is a flow chart of a method for creating a heat dissipating structure according to an embodiment of the present invention.

Referring to FIG. 5 there is shown a flow chart of a method by which the thermally compliant beams 212 are used in a heat sink 216. The first step 510 is to shape the compliant beams 212. Beryllium copper is the preferred material, but any high conductive, high fatigue resistant material could be substituted for Beryllium copper. The beams 212 may be shaped from a solid block of copper or a high conductivity fatigue resistant material. In addition, the heat spreader 208 and the beams 212 may both be shaped from a single of copper or a high conductivity fatigue resistant material to produce a single structure.

In step 520 the compliant beams 212 are angled to produce bending compliance in the X, Y, and Z directions. The beams 212 may have multiple angles. In an alternative embodiment, the beams 212 may be shaped in a serpentine, or "S," shape. It is important that the beams 212 are shaped so that the bottom surfaces of the beams will lie parallel to the chip surface.

Next, in step 530 the heat spreader 208 with the compliant beams 212 attached, is placed under a bearing weight to bring the beams 212 into physical contact with the chip surface 204. The next step 540 is optional. A thermal interface material 210 may be placed between the heat sink 216 and the chip surface 204 so that there is no gap between the two. The thermal interface material 210 may be a thermal paste, solder balls, a sheet of thermally conductive material, or other material suitable for use with a heat sink.

From the foregoing, it is readily apparent that by means of the compliant fingers which are formed in the heat sink attachment, there is achieved a reduction in stress, thus contributing to a reduction in deformation during operation of the chip package.

Therefore, while there have been described what are presently considered to be the preferred embodiments, it will be understood by those skilled in the art that other modifications can be made within the spirit of the invention.

The invention claimed is:

1. A method of producing a heat dissipating structure, the method comprising:
   shaping a plurality of compliant beams;
   attaching the plurality of compliant beams to a surface of a heat spreader, wherein the compliant beams are formed of a high-conductive material such that a maximum stress of each compliant beam is less than a fatigue stress of the high-conductive material; and
   placing the compliant beams in a position such that at least a part of each beam is in a non-perpendicular angle relative to a chip surface such that the compliant beams are able to exert bending compliance in response to x, y, and z forces exerted upon them.

2. The method of claim 1 further comprising:
   placing the heat spreader under a bearing weight to exert z forces on the compliant beams to bring them into physical contact with the chip surface.

3. The method of claim 1 wherein the placing element comprises:
   placing the compliant beams at an angle lying between forty-five degrees and eighty-five degrees relative to the chip surface; and
   wherein a bottom surface of each compliant beam is parallel to the chip surface.

4. The method of claim 1 further comprising:
   placing solder balls between the heat dissipating structure and the chip surface for bonding said heat dissipating structure to the chip surface.

* * * * *